(12) United States Patent
Yeh (10) Patent No.: US 7,859,039 B2
(45) Date of Patent: Dec. 28, 2010

(54) X-SHAPED SEMICONDUCTOR CAPACITOR STRUCTURE

(75) Inventor: Ta-Hsun Yeh, Hsin-Chu (TW)

(73) Assignee: Realtek Semiconductor Corp., Hsinchu (TW)

( * ) Notice: Subject to any disclaimer, the term of this patent is extended or adjusted under 35 U.S.C. 154(b) by 196 days.

(21) Appl. No.: 11/760,785

(22) Filed: Jun. 10, 2007

(65) Prior Publication Data

US 2007/0291439 A1    Dec. 20, 2007

(30) Foreign Application Priority Data

Jun. 16, 2006 (TW) .............................. 95121579 A (51) Int. Cl.
*H01L 27/108* (2006.01)
(52) U.S. Cl. ...................... 257/306; 257/532
(58) Field of Classification Search ................ 257/306, 257/307, 532, E23.144
See application file for complete search history.

(56) References Cited

U.S. PATENT DOCUMENTS

| | | | |
|---|---|---|---|
| 5,583,359 A | 12/1996 | Ng | |
| 5,939,766 A | 8/1999 | Stolmeijer | |
| 6,542,351 B1 | 4/2003 | Kwang | |
| 6,625,006 B1 | 9/2003 | Aram et al. | |
| 6,784,050 B1 | 8/2004 | Sutardja et al. | |
| 6,819,542 B2 * | 11/2004 | Tsai et al. | 361/304 |
| 6,885,543 B1 | 4/2005 | Aram et al. | |
| 6,974,744 B1 | 12/2005 | Aram et al. | |
| 6,980,414 B1 * | 12/2005 | Sutardja | 361/306.3 |
| 2007/0057344 A1 * | 3/2007 | Lee | 257/532 |

FOREIGN PATENT DOCUMENTS

TW        I222089       10/2004

* cited by examiner

*Primary Examiner*—Steven Loke
*Assistant Examiner*—Kimberly M Thomas
(74) *Attorney, Agent, or Firm*—Thomas, Kayden, Horstemeyer & Risley, LLP (57) ABSTRACT

A semiconductor capacitor structure includes a first metal layer, a second metal layer, a first set of via plugs, a second set of via plugs, and a dielectric layer. The first metal layer includes a first portion, a plurality of parallel-arranged second portions, a third portion, and a plurality of parallel-arranged fourth portions. The second metal layer includes a fifth section, a plurality of sixth sections, a seventh section, and a plurality of eighth sections. The first set of via plugs electrically connects the plurality of second sections to the plurality of sixth sections. The second set of via plugs electrically connects the plurality of fourth sections to the plurality of eighth sections.

20 Claims, 8 Drawing Sheets

X-SHAPED SEMICONDUCTOR CAPACITOR STRUCTURE

BACKGROUND OF THE INVENTION

1. Field of the Invention

The present invention relates to a semiconductor capacitor structure, and more particularly, to a metal-insulator-metal (MIM) type capacitor structure.

2. Description of the Prior Art

In semiconductor manufacturing processes, metal capacitors constituted by metal-insulator-metal (MIM) type capacitor structure are widely applied in Ultra Large Scale Integration (ULSI) designs. Due to its lower resistance, less significant parasitic effect, and absence of induced voltage shift in the depletion region, metal capacitors with MIM type structure are usually adopted as the main choice of semiconductor capacitor designs.

Applications of interdigitated metal capacitors have already been disclosed and discussed in various literatures, such as U.S. Pat. No. 6,784,050, U.S. Pat. No. 6,885,543, U.S. Pat. No. 6,974,744, U.S. Pat. No. 6,819,542, and Taiwan Patent No. 222,089 (the Taiwan patent of U.S. Pat. No. 6,819,542), etc., whose contents are incorporated herein by reference.

In U.S. Pat. No. 6,819,542, a multilevel interdigitated metal structure is defined, wherein the multilevel interdigitated metal structure includes at least a plurality of odd layers, a plurality of even layers, and a plurality of dielectric layers. The plurality of odd layers and the plurality of even layers comprise a first electrode and a second electrode. The first electrode in the plurality of odd layers is coupled to the first electrode in the plurality of even layers through a first bus. The second electrode in the plurality of odd layers is coupled to the second electrode in the plurality of even layers through a second bus.

Figure 1:
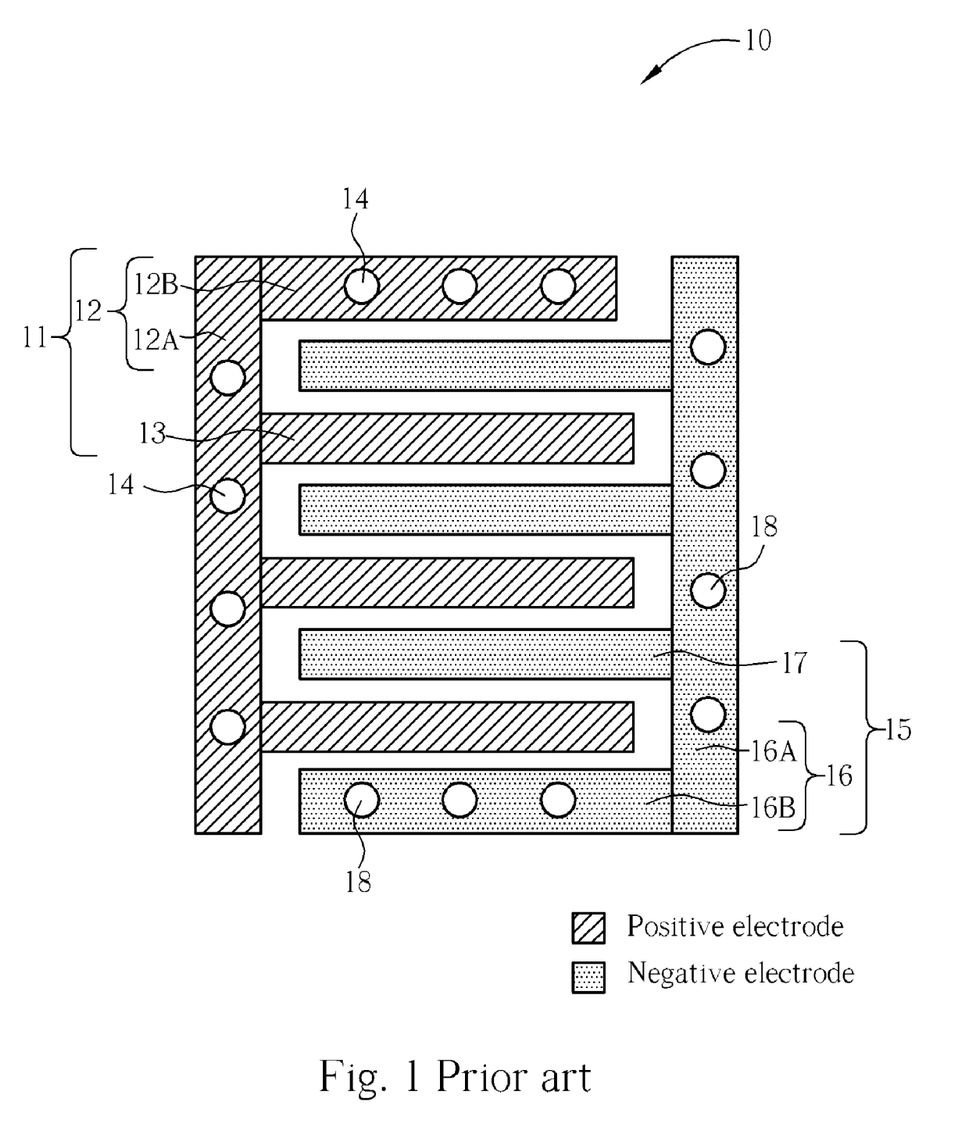
FIG. 1 is a diagram of an odd layer of a multilevel interdigitated metal structure according to the conventional art.
Figure 2:
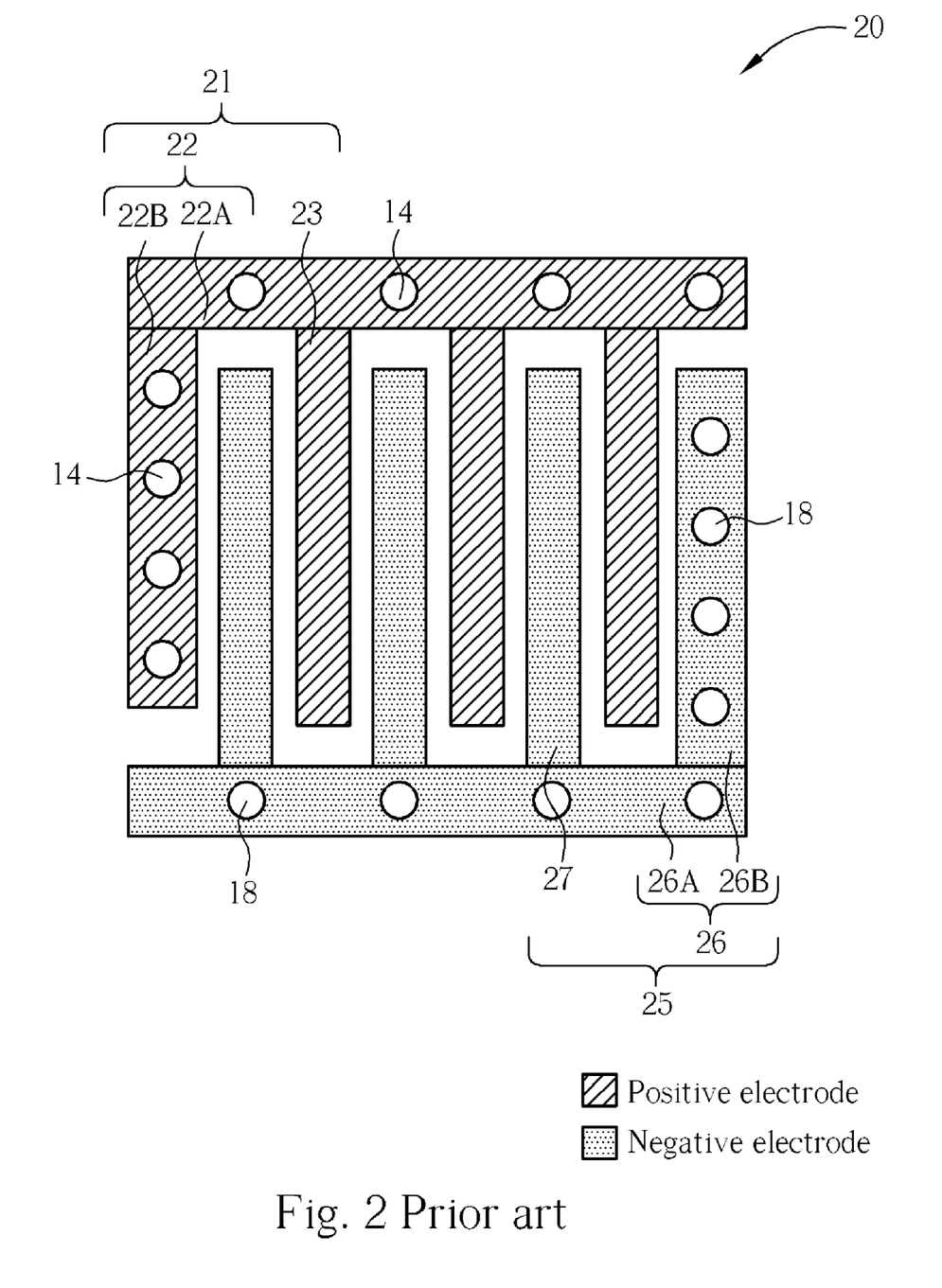
FIG. 2 is a diagram of an even layer of a multilevel interdigitated metal structure according to the conventional art.

In U.S. Pat. No. 6,819,542 (hereinafter "the '542 patent"), a multilevel interdigitated metal structure is defined. Please refer to FIG. 1 and FIG. 2. FIG. 1 is a diagram of an odd layer 10 of a multilevel interdigitated metal structure as shown in FIG. 5B of the '542 patent. FIG. 2 is a diagram of an even layer 20 of a multilevel interdigitated metal structure as shown in FIG. 6B of the '542 patent.

Please first refer to FIG. 1. The odd layer 10 comprises a first electrode 11 and a second electrode 15. The first electrode 11 includes a first section 12, and a plurality of second sections 13 arranged in parallel. The first section 12 includes a first portion 12A and a second portion 12B. The first portion 12A and the second portion 12B respectively constitute the two strokes of the L-shaped first section 12. The plurality of parallel-arranged second sections 13 join the first portion 12A of the first section 12, and separate from one another by a predetermined distance. The second electrode 15 includes a first section 16, and a plurality of second sections 17 arranged in parallel. The first section 16 includes a first portion 16A and a second portion 16B. The first portion 16A and the second portion 16B respectively constitute the two strokes of the L-shaped first section 16. The plurality of parallel-arranged second sections 17 join the first portion 16A of the first section 16, and separate from one another by a predetermined distance. The plurality of second sections 13 of the first electrode 11 and the plurality of second sections 17 of the second electrode 15 interdigitate in parallel.

Please now refer to FIG. 2. The even layer 20 includes a first electrode 21 and a second electrode 25. The first electrode 21 includes a first section 22, and a plurality of second sections 23 arranged in parallel. The first section 22 includes a first portion 22A and a second portion 22B. The first portion 22A and the second portion 22B respectively constitute the two strokes of the L-shaped first section 22. The plurality of parallel-arranged second sections 23 join the first portion 22A of the first section 22, and separate from one another by a predetermined distance. The second electrode 25 includes a first section 26, and a plurality of second sections 27 arranged in parallel. The first section 26 includes a first portion 26A and a second portion 26B. The first portion 26A and the second portion 26B respectively constitute the two strokes of the L-shaped first section 26. The plurality of parallel-arranged second sections 27 join the first portion 26A of the first section 26, and separate from one another by a predetermined distance. The plurality of second sections 23 of the first electrode 21 and the plurality of second sections 27 of the second electrode 25 interdigitate in parallel. The second section 13 of the first electrode 11 in FIG. 1 is perpendicular to the second section 23 of the first electrode 21 in FIG. 2.

In Taiwan Patent No. 222,089 (hereinafter "the '089 patent"), a capacitor structure is disclosed, wherein the first section 12 of the first electrode 11 in the odd layer 10 and the first section 22 of the first electrode 21 in the even layer 20 are electrically coupled through a plurality of via plugs 14. Further, the first section 16 of the second electrode 15 in the odd layer 10 and the first section 26 of the second electrode 25 in the even layer 20 are electrically connected through a plurality of via plugs 18. By doing so, a capacitor structure spanning across several metal layers can be formed, wherein the first electrode 11 and the first electrode 21 together constitute the positive electrode, and the second electrode 15 and the second electrode 25 together constitute the negative electrode.

Although a multilevel interdigitated metal structure is already disclosed in U.S. Pat. No. 6,819,542, the electrical connection of the part of an electrode in the odd layer and the part of the same electrode in the even layer requires extra conducting wire structures, which results in wirings overly complicated. In U.S. Pat. No. 6,819,542, another multilevel interdigitated metal structure is disclosed, wherein the electrical connection of the part of an electrode in the odd layer and the part of the same electrode in the even layer is formed with via plugs. However, the positioning of via plugs is limited to the periphery of electrodes, which results in smaller unit capacitance.

SUMMARY OF THE INVENTION

It is therefore an object of the present invention to provide a semiconductor capacitor structure of better capacitance characteristic and higher unit capacitance through proper allocation of via plugs' position.

It is therefore another object of the present invention to provide a semiconductor capacitor structure, which, through proper allocation of via plugs' position, electrically connects parts of the same electrode across various metal layers without adopting extra conducting wire structures, whereby the wirings can be simplified.

Certain claimed embodiments define a semiconductor capacitor structure. The semiconductor capacitor structure includes a first metal layer, a second metal layer, a first set of via plugs, a second set of via plugs, and a dielectric layer. The first metal layer includes a first portion and a second portion. The second metal layer includes a third portion and a fourth portion. The first portion includes a first section and a plurality of parallel-arranged second sections coupled to the first section. The second portion includes a third section and a plurality of parallel-arranged fourth sections coupled to the third section. The plurality of second sections and the plurality of fourth sections interdigitate in parallel. The third portion includes a fifth section and a plurality of parallel-arranged sixth sections coupled to the fifth section. The fourth portion includes a seventh section and a plurality of parallel-arranged eighth sections coupled to the seventh section. The plurality of sixth sections and the plurality of eighth sections interdigitate in parallel. The plurality of sixth sections and the plurality of second sections are not in parallel. The first set of via plugs electrically connects the plurality of second sections to the plurality of sixth sections. The second set of via plugs electrically connects the plurality of fourth sections to the plurality of eighth sections. The dielectric layer is formed between the first metal layer and the second metal layer.

Certain claimed embodiments define a semiconductor capacitor structure. The semiconductor capacitor structure includes a plurality of first strip portions, a plurality of second strip portions, a plurality of third strip portions, a plurality of fourth strip portions, a plurality of first via plugs and a plurality of second via plugs. The plurality of first strip portions are located in a first conductive layer. The plurality of first strip portions are arranged in parallel. The plurality of second strip portions are located in the first conductive layer. The plurality of second strip portions are arranged in parallel, and the plurality of second strip portions and the plurality of first strip portions interdigitate in parallel. The plurality of third strip portions are located in a second conductive layer. The plurality of third strip portions are arranged in parallel. The plurality of fourth strip portions are located in the second conductive layer. The plurality of fourth strip portions are parranged in parallel, and the plurality of fourth strip portions and the plurality of third strip portions interdigitate in parallel. The plurality of first via plugs are located in and among a dielectric layer. The plurality of first via plugs are electrically coupled the plurality of first strip portions to the plurality of third strip portions, and are located at cross points of the plurality of first strip portions and the plurality of third strip portions. The plurality of second via plugs are located in and among the dielectric layer. The plurality of second via plugs are electrically coupled the plurality of second strip portions to the plurality of fourth strip portions, and are located at cross points of the plurality of second strip portions and the plurality of fourth strip portions. The plurality of first strip portions and the plurality of third strip portions are not in parallel.

These and other objectives of the present invention will no doubt become obvious to those of ordinary skill in the art after reading the following detailed description of the preferred embodiment that is illustrated in the various figures and drawings.

DETAILED DESCRIPTION

The semiconductor capacitor structures described in the embodiments of the invention adopt the capacitor manufacturing technologies embodying metal-insulator-metal (MIM) type structures, such as a metal-oxide-metal (MOM) structure. In other words, the capacitors in the embodiments of the present invention include metal layers as conductive material and insulator layers such as oxide layers as dielectric material. However, as would be appreciated by those of ordinary skill in the pertinent art, the realization of the core concept of the present invention is not necessarily limited to those disclosed in the embodiments as hereinafter described. Other known or novel conductive materials or dielectric materials can also be applied to implement the capacitor structure of the invention.

Figure 3:
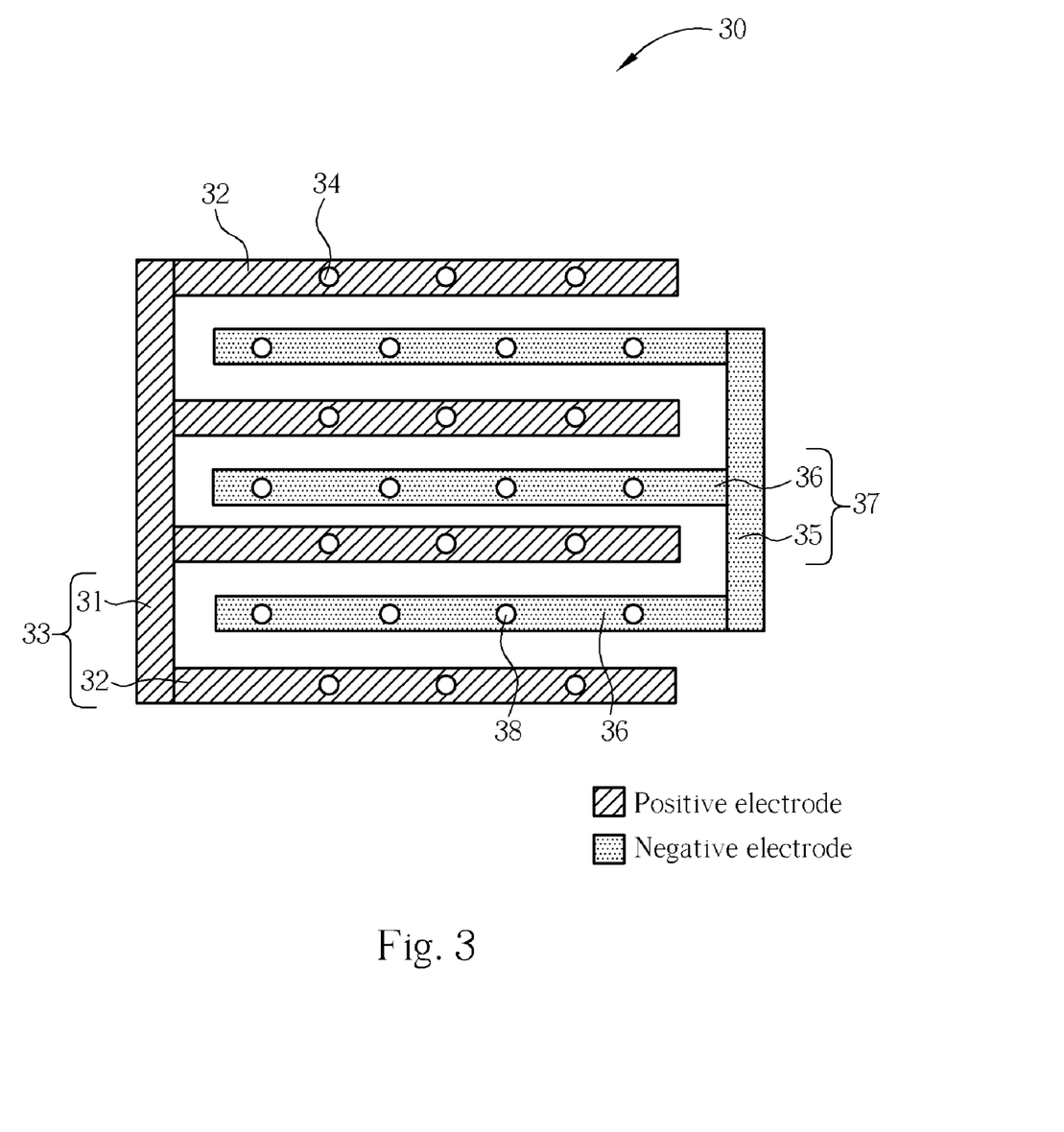
FIG. 3 is a diagram of a first metal layer of an X-shaped semiconductor capacitor structure according to an embodiment of the present invention.

Please refer to FIG. 3. FIG. 3 is a diagram of a first metal layer 30 of an X-shaped semiconductor capacitor structure according to an embodiment of the present invention. The first metal layer 30 includes a first portion 33 and a second portion 37. The first portion 33 includes a first section 31 and a plurality of parallel-arranged second sections 32. The plurality of second sections 32 are coupled to the first section 31 and perpendicular to the first section 31. The second portion 37 includes a third section 35 and a plurality of parallel-arranged fourth sections 36. The plurality of fourth sections 36 are coupled to the third section 35 and perpendicular to the third section 35. The plurality of second sections 32 and the plurality of fourth sections 36 interdigitate in parallel. In this embodiment, the first portion 33 of the first metal layer 30 is used as a part of a first electrode (such as the positive electrode) of the semiconductor capacitor structure, and the second portion 37 of the first metal layer 30 is used as a part of a second electrode (such as the negative electrode) of the semiconductor capacitor structure.

Figure 4:
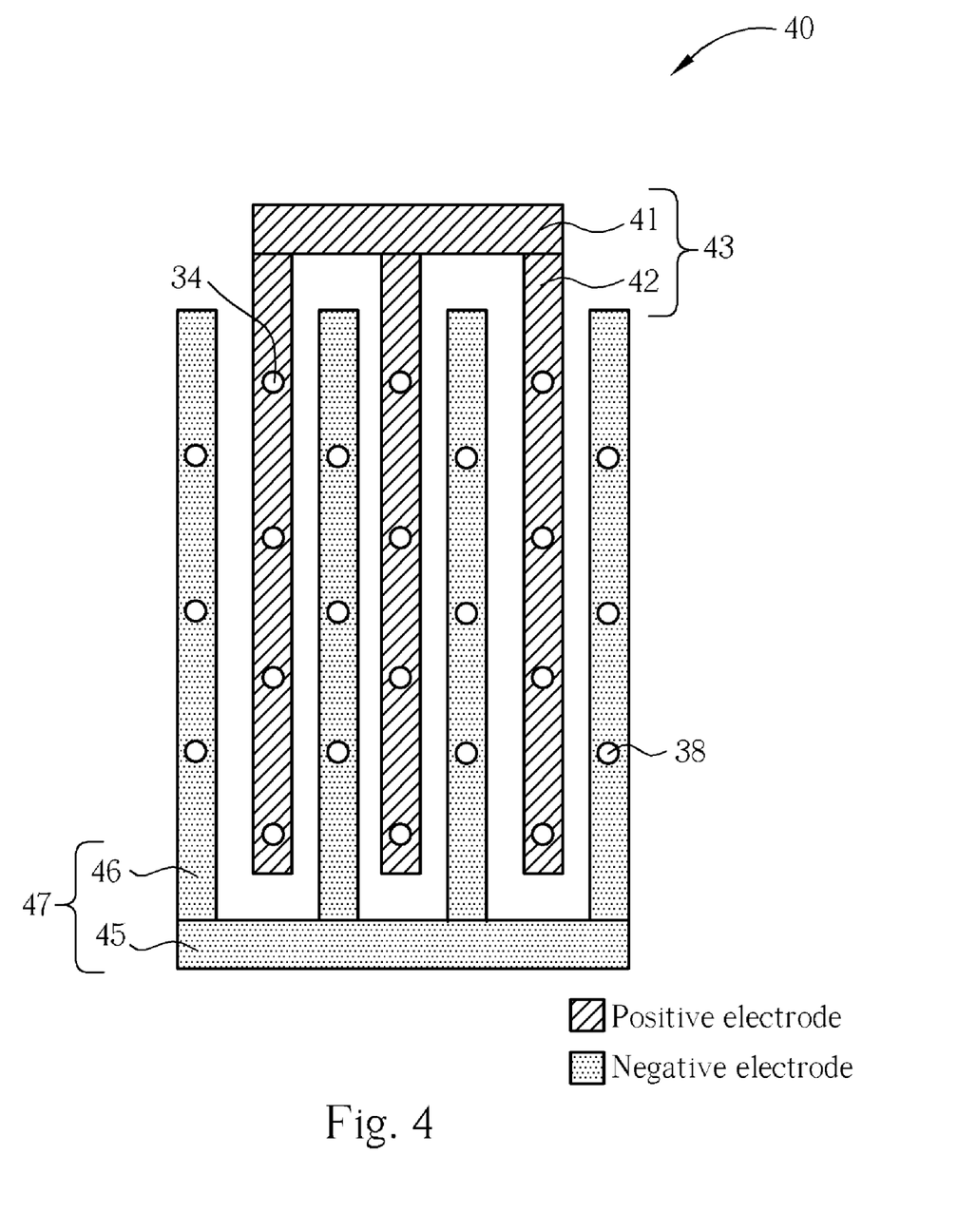
FIG. 4 is a diagram of a second metal layer of the X-shaped semiconductor capacitor structure according to the same embodiment as shown in FIG. 3.

Please refer to FIG. 4. FIG. 4 is a diagram of a second metal layer 40 of the X-shaped semiconductor capacitor structure in FIG. 3. The second metal layer 40 includes a third portion 43 and a fourth portion 47. The third portion 43 includes a fifth sections 41 and a plurality of parallel-arranged sixth sections 42. The plurality of sixth sections 42 are coupled to the fifth section 41 and perpendicular to the fifth section 41. The fourth portion 47 includes a seventh section 45 and a plurality of parallel-arranged eighth sections 46. The plurality of sixth sections 42 and the plurality of eighth sections 46 interdigitate in parallel. The plurality of sixth sections 42 are perpendicular to the plurality of second sections 32 in FIG. 3. In this embodiment, the third portion 43 of the second metal layer 40 is used as a part of the first electrode (such as the positive electrode) of the semiconductor capacitor structure, and the fourth portion 47 of the second metal layer 40 is used as a part of the second electrode (such as the negative electrode) of the semiconductor capacitor structure.

It is to be noted that the materials used in the first metal layer 30 and the second metal layer 40 could be aluminum, copper, gold, or any other kind of metal material or even nonmetal material, depending on the adopted semiconductor manufacturing technology.

In the X-shaped semiconductor capacitor structure of this embodiment, there is a dielectric layer (not shown in figures)

lying between the first metal layer 30 and the second metal layer 40. Material such as an oxide layer with high dielectric coefficient can be adopted as the material of the dielectric layer between the two electrodes of the semiconductor capacitor. In this embodiment, the semiconductor capacitor structure includes a plurality of via plugs 34 distributed in the dielectric layer. The plurality of via plugs 34 are electrically coupled between the plurality of second sections 32 of the first portion 33 of the first metal layer 30 and the plurality of sixth sections 42 of the third portion 43 of the second metal layer 40. The plurality of via plugs 34 spread out in a constellatory pattern as shown in FIG. 3 and FIG. 4. The plurality of via plugs 34 are used for constituting the electrical connection between the first portion 33 and the third portion 43, such that they form an integrated capacitor electrode (the positive electrode). Similarly in this embodiment, the semiconductor capacitor structure further includes a plurality of via plugs 38 distributed in the dielectric layer. The plurality of via plugs 38 are electrically coupled between the plurality of fourth sections 36 of the second portion 37 of the first metal layer 30 and the plurality of eighth sections 46 of the fourth portion 43 of the second metal layer 40. The plurality of via plugs 38 spread out in a constellatory pattern as shown in FIG. 3 and FIG. 4. The plurality of via plugs 38 are used for constituting the electrical connection between the second portion 37 and the fourth portion 47, such that they form another integrated capacitor electrode (the negative electrode).

Figure 5:
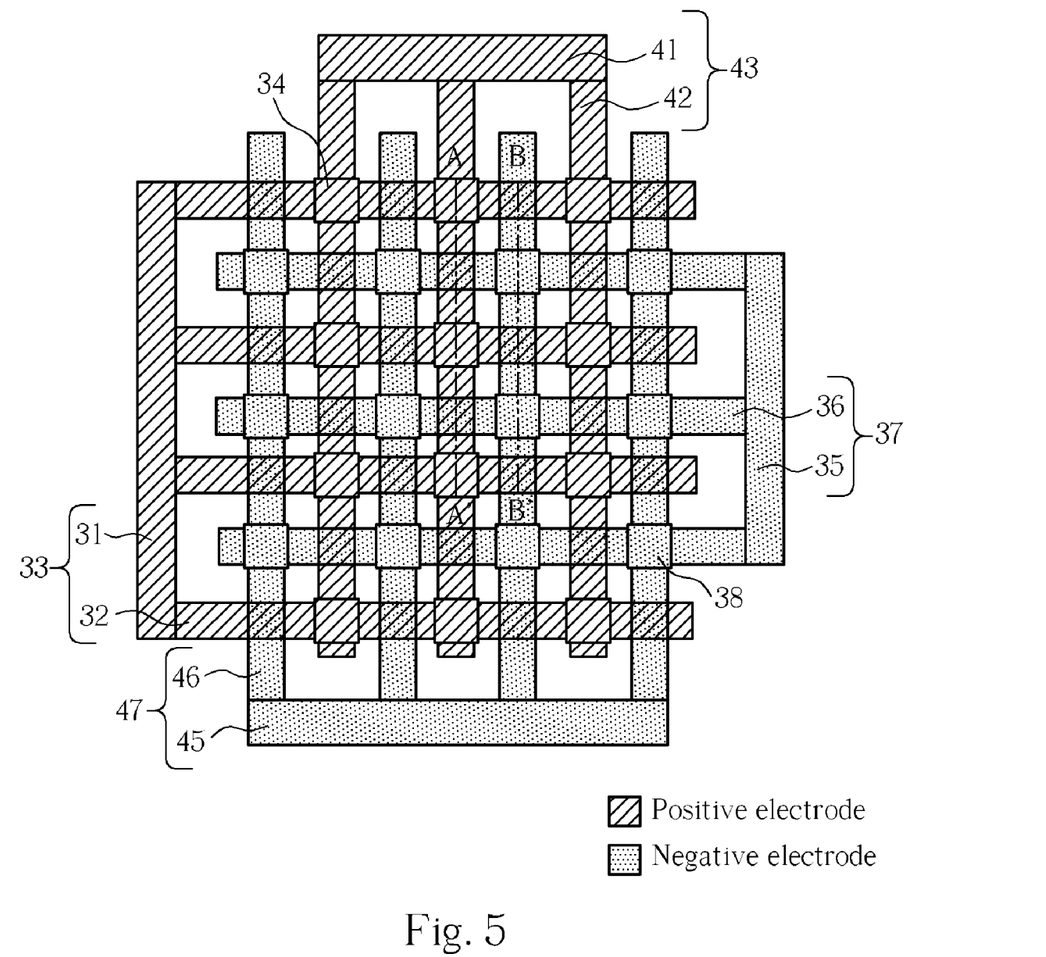
FIG. 5 is a diagram of the X-shaped semiconductor capacitor structure by jointly illustrating the details in FIG. 3 and FIG. 4.

Please refer to FIG. 5. FIG. 5 is a diagram of the X-shaped semiconductor capacitor structure by jointly illustrating the details in FIG. 3 and FIG. 4. Along the horizontal direction shows the first portion 33 and the second portion 37 of the first metal layer 30, and along the vertical direction shows the third portion 43 and the fourth portion 47 of the second metal layer 40. In this embodiment, the geometrical patterns in different metal layers of the semiconductor capacitor structure, when viewed from top (i.e., plan view), are arranged to have a particular angle therebetween, as shown in the embodiment in FIG. 5 of 90 degrees, and are not in parallel (or, not of 0 degree angle). That is, the plurality of second sections 32 in FIG. 3 cross the plurality of sixth sections 42 in FIG. 4 at 90 degrees. The first metal layer 30 and the second metal layer 40 lie on different layers. The second metal layer 40 may lie either above or below the first metal layer 30, and there lies the dielectric layer between them (though not shown in FIG. 5). As clearly shown in FIG. 5, the plurality of via plugs 34 located in and among the dielectric layer is used for electrically connecting the plurality of second sections 32 of the first metal layer 30 and the plurality of sixth sections 42 of the second metal layer 40. The plurality of via plugs 34 are located at cross points of the plurality of second sections 32 of the first metal layer 30 and the plurality of sixth sections 42 of the second metal layer 40, and spread out as a constellatory pattern. Similarly, the plurality of via plugs 38 located in and among the dielectric layer is used for electrically connecting the plurality of fourth sections 36 of the first metal layer 30 and the plurality of eighth sections 46 of the second metal layer 40. The plurality of via plugs 38 are located at cross points of the plurality of fourth sections 36 of the first metal layer 30 and the plurality of eighth sections 46 of the second metal layer 40, and spread out as a constellatory pattern.

Figure 6:
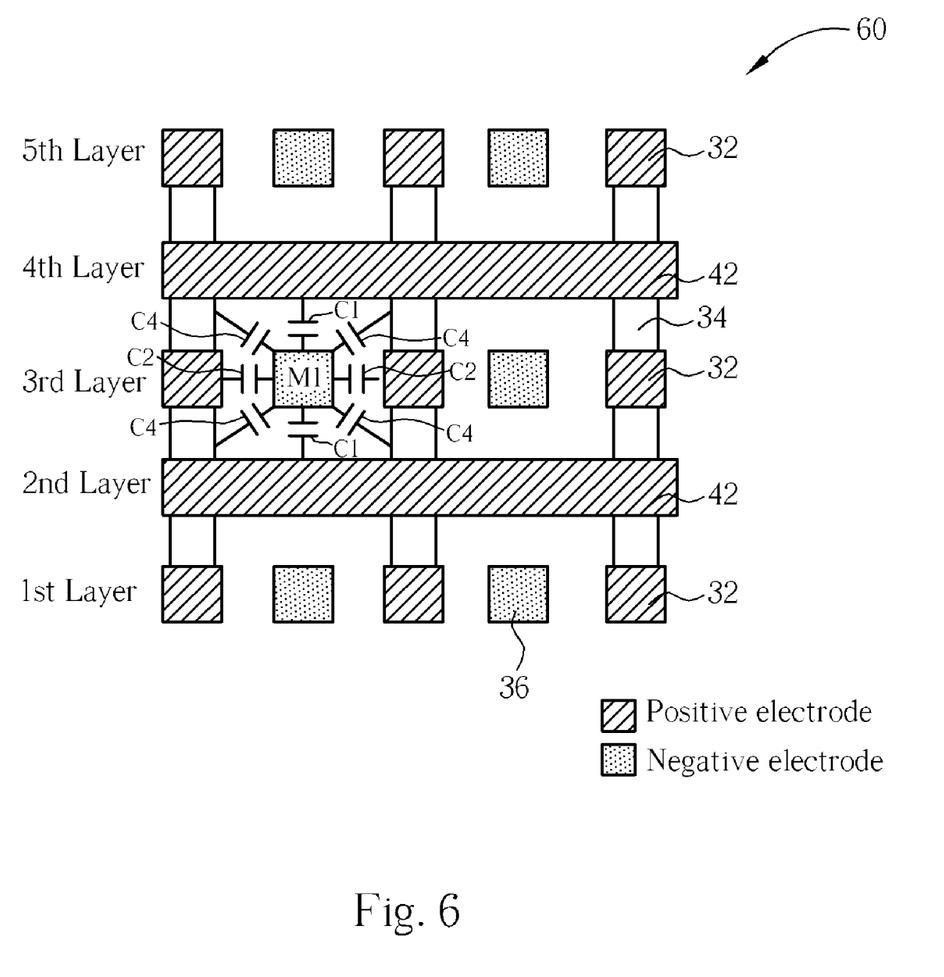
FIG. 6 is a diagram of a vertical cross-section of the X-shaped semiconductor capacitor structure according to an embodiment of the present invention

Please refer to FIG. 6 that is a diagram of a vertical cross-section 60 of the X-shaped semiconductor capacitor structure according to an embodiment of the present invention, for example, the vertical cross-section along the AA' line segment in FIG. 5. The vertical cross-section 60 of the X-shaped semiconductor capacitor structure illustrates five metal layers, wherein the first layer, the third layer, and the fifth layer may be manufactured with the pattern of the first metal layer 30 shown in FIG. 3, all of which include the plurality of second sections 32 of the first portion 33 and the plurality of fourth sections 36 of the second portion 37; whereas the second layer and the fourth layer may be manufactured with the pattern of the second metal layer 40 shown in FIG. 4, all of which include the plurality of sixth sections 42 of the third portion 44 (that is, only the plurality of sixth sections 42 can be seen in the cross section of FIG. 6). The plurality of via plugs 34 is used for electrically connecting the plurality of second sections 32 and the plurality of sixth sections 42. Taking a metal strip M1 in the third layer, which is a part of the negative electrode, as an example, those structures forming part of the positive electrode, which are disposed around in the vicinity of the metal strip M1 and thus significant capacitance effect results between them, include not only the metal strips one layer above and one layer below (contributing to the capacitance effect represented as C1), the metal strips in the same layer (contributing to the capacitance effect represented as C2), but even the via plugs 34 for forming electrical connections between various layers (contributing to the capacitance effect represented as C4).

Figure 7:
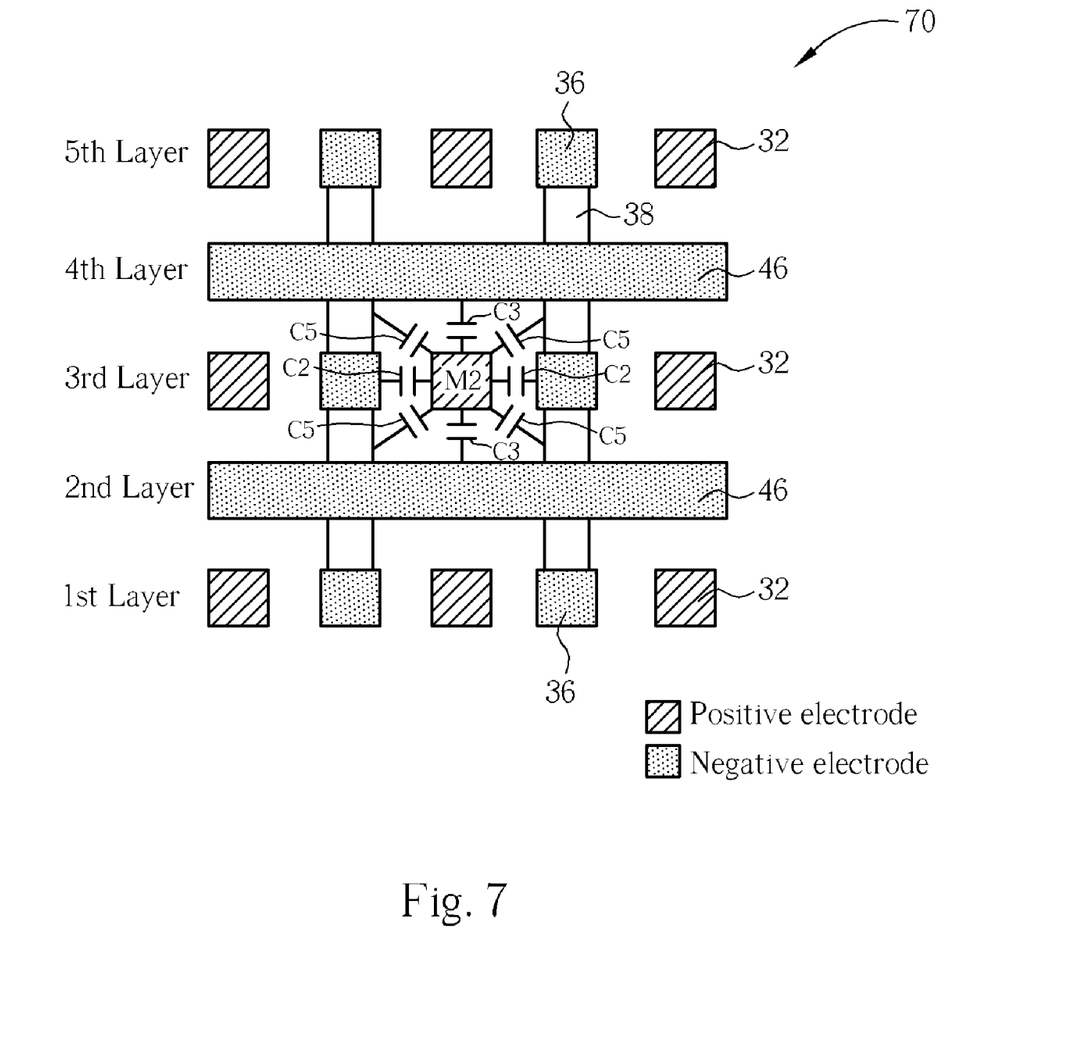
FIG. 7 is a diagram of another vertical cross-section of the X-shaped semiconductor capacitor structure according to an embodiment of the present invention.

Please refer to FIG. 7 that is a diagram of another vertical cross-section 70 of the X-shaped semiconductor capacitor structure according to an embodiment of the present invention, for example, the vertical cross-section along the BB' line segment in FIG. 5. The vertical cross-section 70 of the X-shaped semiconductor capacitor structure illustrates five metal layers, wherein the first layer, the third layer, and the fifth layer may be manufactured with the pattern of the first metal layer 30 shown in FIG. 3, all of which include the plurality of second sections 32 of the first portion 33 and the plurality of fourth sections 36 of the second portion 37; whereas the second layer and the fourth layer may be manufactured with the pattern of the second metal layer 40 shown in FIG. 4, all of which include the plurality of eighth sections 46 of the fourth portion 47 (that is, only the plurality of eighth sections 46 can be seen in the cross section of FIG. 7). The plurality of via plugs 38 is used for connecting the plurality of fourth sections 36 and the plurality of eighth sections 46. Taking a metal strip M2 in the third layer, which is a part of the positive electrode, as an example, those structures forming part of the negative electrode, which are disposed around in the vicinity of the metal strip M2 and thus significant capacitance effect results between them, include not only the metal strips one layer above and one layer below (contributing to the capacitance effect represented as C3), the metal strips in the same layer (contributing to the capacitance effect represented as C2), but even the via plugs 34 for forming electrical connections between various layers (contributing to the capacitance effect represented as C5).

Although examples of cross-section diagram of FIG. 5 are only given along the vertical direction as in FIG. 6 and FIG. 7, to demonstrate the capacitance effect induced in the semiconductor capacitor structure of the present invention, those of ordinary skill in the art should be able to appreciate that similar capacitance effect can also be observed in a cross-section diagram of FIG. 5 along the horizontal direction. Obviously, due to the existence of the via plugs distributed among the various metal layers for forming electrical connections, the X-shaped semiconductor capacitor structure disclosed in the embodiments of the present invention exhibits greater unit capacitance. Moreover, because the electrical connections between metal layers are realized with via plugs distributed within and among the capacitor structure and thus forming an integrated portion thereof, the semiconductor capacitor structure does not need extra connecting structures, which in turn simplifies wiring.

Figure 8:
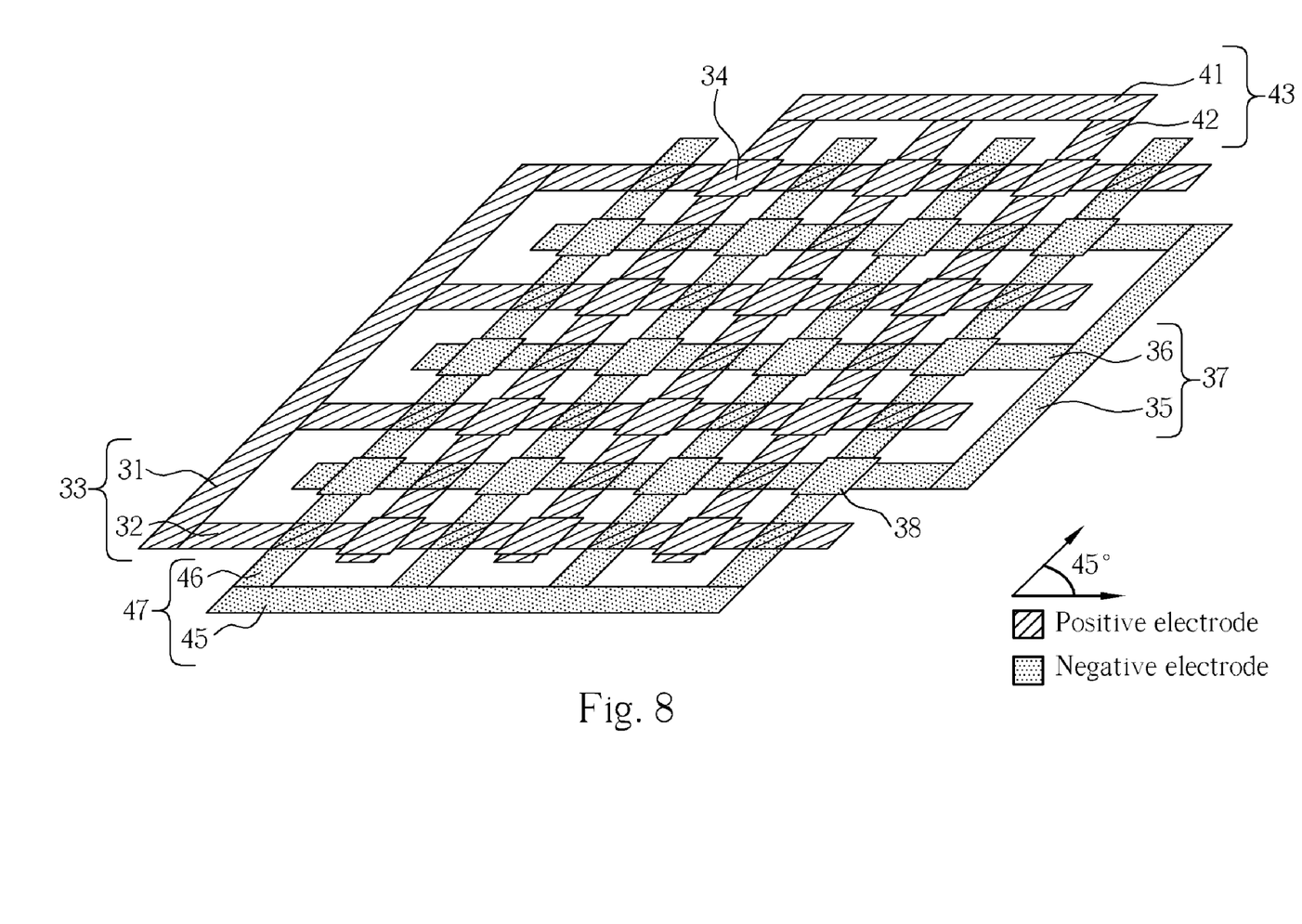
FIG. 8 is a diagram of an X-shaped semiconductor capacitor structure according to another embodiment of the present invention.

The abovementioned embodiments are presented merely as example, and should not be viewed as limiting the scope of the present invention. In above embodiments, the via plugs are spread out and distributed in a constellatory pattern, but the present invention is not limited thereto. Any other known or new configurations, which can substantially increase unit capacitance, fall within the scope of the present invention. Furthermore, although in above embodiments the geometrical patterns in the various metal layers are designed as perpendicular to each other, as are widely seen in current semiconductor manufacturing technologies, the present invention is not limited thereto. It is not essential that the angle between the patterns in different metal layers is chosen to be 90 degrees, and adopting any angle other than 90 degrees still conforms to the spirit of the present invention. As shown in FIG. 8, it is an embodiment where the angle between the pattern in the first metal layer and the pattern in the second metal layer is 45 degrees.

From the above descriptions, the present invention provides a semiconductor capacitor structure. Because those parts in the first metal layers and those parts in the second metal layers, which together constitute the electrode of one polarity, do not need extra conductive wiring constructions to support electrical connection between them, wirings are simplified. In addition, by adopting the via plugs to connect those structures in the first metal layers and the second metal layers constituting the same electrode, unit capacitance can be improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor capacitor structure comprising:
   a first metal layer, the first metal layer comprising:
   a first portion comprising a first section and a plurality of parallel-arranged second sections coupled to the first section; and
   a second portion comprising a third section and a plurality of parallel-arranged fourth sections coupled to the third section, the plurality of second sections and the plurality of fourth sections interdigitate in parallel;
   a second metal layer, the second metal layer comprising:
   a third portion comprising a fifth section and a plurality of parallel-arranged sixth sections coupled to the fifth section; and
   a fourth portion comprising a seventh section and a plurality of parallel-arranged eighth sections coupled to the seventh section, the plurality of sixth sections and the plurality of eighth sections interdigitate in parallel, and the plurality of sixth sections and the plurality of second sections are not in parallel;
   a first set of via plugs for electrically connecting the plurality of second sections to the plurality of sixth sections;
   a second set of via plugs for electrically connecting the plurality of fourth sections to the plurality of eighth sections; and
   a dielectric layer formed between the first metal layer and the second metal layer;
   wherein the first section and the third section of the first metal layer do not overlap with any sections in the second metal layer.

2. The semiconductor capacitor structure of claim 1, wherein the first portion and the third portion together constitute a part of a positive electrode of the semiconductor capacitor structure.

3. The semiconductor capacitor structure of claim 1, wherein the first portion and the third portion together constitute a part of a negative electrode of the semiconductor capacitor structure.

4. The semiconductor capacitor structure of claim 1, wherein the second portion and the fourth portion together constitute a part of a positive electrode of the semiconductor capacitor structure.

5. The semiconductor capacitor structure of claim 1, wherein the second portion and the fourth portion together constitute a part of a negative electrode of the semiconductor capacitor structure.

6. The semiconductor capacitor structure of claim 1, wherein material of the first metal layer is aluminum, copper, or gold.

7. The semiconductor capacitor structure of claim 1, wherein material of the second metal layer is aluminum, copper, or gold.

8. The semiconductor capacitor structure of claim 1, wherein the plurality of second sections crosses the plurality of sixth sections at about 90 degrees.

9. The semiconductor capacitor structure of claim 1, wherein the first set of via plugs includes a plurality of first via plugs, the plurality of first via plugs spread out between the plurality of second sections and the plurality of sixth sections as a constellatory pattern.

10. The semiconductor capacitor structure of claim 1, wherein the second set of via plugs includes a plurality of second via plugs, the plurality of second via plugs spread out between the plurality of fourth sections and the plurality of eighth sections as a constellatory pattern.

11. A semiconductor capacitor structure comprising:
    a plurality of first strip portions located in a first conductive layer, the plurality of first strip portions are arranged in parallel;
    a plurality of second strip portions located in the first conductive layer, the plurality of second strip portions are arranged in parallel, and the plurality of second strip portions and the plurality of first strip portions interdigitate in parallel;
    a plurality of third strip portions located in a second conductive layer, the plurality of third strip portions are arranged in parallel;
    a plurality of fourth strip portions located in the second conductive layer, the plurality of fourth strip portions are arranged in parallel, and the plurality of fourth strip portions and the plurality of third strip portions interdigitate in parallel;
    a plurality of first via plugs located in a dielectric layer, the plurality of first via plugs electrically coupled the plurality of first strip portions to the plurality of third strip portions and located at cross points of the plurality of first strip portions and the plurality of third strip portions; and
    a plurality of second via plugs located in the dielectric layer, the plurality of second via plugs electrically coupled the plurality of second strip portions to the plurality of fourth strip portions and located at cross points of the plurality of second strip portions and the plurality of fourth strip portions;
    wherein the plurality of first strip portions and the plurality of third strip portions are not in parallel, wherein respective strips in the first conductive layer that couple the first strip portions and second strip portions do not overlap with respective strips in the second conductive layer that couple the third strip portions and the fourth strip portions.

12. The semiconductor capacitor structure of claim 11, wherein the plurality of first strip portions and the plurality of third strip portions together constitute a part of one electrode of the semiconductor capacitor structure, and the plurality of second strip portions and the plurality of fourth strip portions together constitute a part of another electrode of the semiconductor capacitor structure.

13. The semiconductor capacitor structure of claim 11, wherein the first conductive layer lies below the second conductive layer and the dielectric layer lies between the first conductive layer and the second conductive layer.

14. The semiconductor capacitor structure of claim 11, wherein material of the first conductive layer is aluminum, copper, or gold.

15. The semiconductor capacitor structure of claim 11, wherein material of the second conductive layer is aluminum, copper, or gold.

16. The semiconductor capacitor structure of claim 11, wherein the dielectric layer is an oxide layer.

17. The semiconductor capacitor structure of claim 11, wherein the plurality of first strip portions crosses the plurality of third strip portions at about 90 degrees.

18. The semiconductor capacitor structure of claim 11, wherein the plurality of first via plugs are spread out between the plurality of first strip portions and the plurality of third strip portions as a constellatory pattern.

19. The semiconductor capacitor structure of claim 11, wherein the plurality of second via plugs are spread out between the plurality of second strip portions and the plurality of fourth strip portions as a constellatory pattern.

20. The semiconductor capacitor structure of claim 1, wherein the fifth section and the seventh section of the second metal layer do not overlap with any sections in the first metal layer.

* * * * *